United States Patent
Noma et al.

(10) Patent No.: US 9,391,034 B2
(45) Date of Patent: Jul. 12, 2016

(54) INTERFACIAL ALLOY LAYER FOR IMPROVING ELECTROMIGRATION (EM) RESISTANCE IN SOLDER JOINTS

(71) Applicant: International Business Machines Corporation, Armonk, NY (US)

(72) Inventors: Hirokazu Noma, Kawasaki (JP); Yasumitsu Orii, Kawasaki (JP); Kazushige Toriyama, Kawasaki (JP)

(73) Assignee: International Business Machines Corporation, Armonk, NY (US)

( * ) Notice: Subject to any disclaimer, the term of this patent is extended or adjusted under 35 U.S.C. 154(b) by 281 days.

(21) Appl. No.: 13/973,434

(22) Filed: Aug. 22, 2013

(65) Prior Publication Data

US 2014/0061889 A1    Mar. 6, 2014

(30) Foreign Application Priority Data

Aug. 23, 2012  (JP) .................. 2012-184528

(51) Int. Cl.
*H01L 21/00*   (2006.01)
*H01L 23/00*   (2006.01)
(Continued)

(52) U.S. Cl.
CPC .............. *H01L 24/08* (2013.01); *H01L 21/563* (2013.01); *H01L 24/03* (2013.01); *H01L 24/16* (2013.01); *H01L 24/81* (2013.01); *H01L 24/92* (2013.01); *H01L 21/50* (2013.01); *H01L 24/05* (2013.01); *H01L 24/11* (2013.01); *H01L 24/13* (2013.01); *H01L 24/29* (2013.01); *H01L 24/32* (2013.01); *H01L 24/33* (2013.01); *H01L 24/83* (2013.01);

(Continued)

(58) Field of Classification Search
CPC ......... H01L 24/08; H01L 24/16; H01L 24/81; H01L 24/92; H01L 21/563; H01L 24/03; H01L 2224/16225
See application file for complete search history.

(56) References Cited

U.S. PATENT DOCUMENTS

| 8,957,323 B2* | 2/2015 | Chen ................. H01L 23/49811 174/257 |
| 2010/0247955 A1* | 9/2010 | Takahashi ............ B23K 1/0016 428/647 |

FOREIGN PATENT DOCUMENTS

| JP | 2002-254194 A | 9/2002 |
| JP | 2003-260587 A | 9/2003 |

(Continued)

OTHER PUBLICATIONS

Deng et al "Influence of Initial Morphology and Thickness of Cu6Sn5 and Cu3Sn Intermetallics on Growth and Evolution during Thermal Aging of Sn—Ag Solder/Cu Joints" Journal of Electronic Materials, vol. 22, No. 12, Dec. 2003 pp. 1403-1413.*

(Continued)

*Primary Examiner* — Laura Menz
(74) *Attorney, Agent, or Firm* — Scully, Scott, Murphy & Presser, P.C.; Keivan Razavi

(57) ABSTRACT

Problem
To improve the electromigration (EM) resistance of a solder joint.
Solution
The present invention provides a unique structure for an interfacial alloy layer which is able to improve the electromigration (EM) resistance of a solder joint, and a unique method of forming this structure. More specifically, in this unique structure, a controlled interfacial alloy layer is provided on both sides of a solder joint. In order to form this structure, aging (maintenance of high-temperature conditions) is performed until an interfacial alloy layer of Cu3Sn has a thickness of at least 1.5 μm.

6 Claims, 8 Drawing Sheets

(51) Int. Cl.
*H01L 21/56* (2006.01)
*H01L 21/50* (2006.01)

(52) U.S. Cl.
CPC .......... *H01L 2224/03828* (2013.01); *H01L 2224/0401* (2013.01); *H01L 2224/05647* (2013.01); *H01L 2224/11849* (2013.01); *H01L 2224/131* (2013.01); *H01L 2224/13111* (2013.01); *H01L 2224/16225* (2013.01); *H01L 2224/16227* (2013.01); *H01L 2224/16503* (2013.01); *H01L 2224/2919* (2013.01); *H01L 2224/32225* (2013.01); *H01L 2224/33181* (2013.01); *H01L 2224/73204* (2013.01); *H01L 2224/73253* (2013.01); *H01L 2224/8191* (2013.01); *H01L 2224/81191* (2013.01); *H01L 2224/81192* (2013.01); *H01L 2224/81193* (2013.01); *H01L 2224/81447* (2013.01); *H01L 2224/81815* (2013.01); *H01L 2224/81948* (2013.01); *H01L 2224/83102* (2013.01); *H01L 2224/83862* (2013.01); *H01L 2224/92* (2013.01); *H01L 2224/92125* (2013.01); *H01L 2224/92225* (2013.01); *H01L 2924/10253* (2013.01); *H01L 2924/15153* (2013.01); *H01L 2924/15311* (2013.01); *H01L 2924/16152* (2013.01); *H01L 2924/3512* (2013.01); *H01L 2924/3656* (2013.01)

(56) References Cited

FOREIGN PATENT DOCUMENTS

| | | |
|---|---|---|
| JP | 2009-188107 A | 8/2009 |
| JP | 2010-040691 A | 2/2010 |
| JP | 2011-086837 A | 4/2011 |
| JP | 2011-187635 A | 9/2011 |
| WO | WO 2008/084673 | 7/2008 |

OTHER PUBLICATIONS

Chao et al., "Electromigration-Enhanced Intermetallic Growth and Void Formation in Pb-Free Solder Joints", Journal of Applied Physics 100, 084909 (2006), Downloaded Nov. 10, 2006, pp. 084909-1-084909-10.

\* cited by examiner

Joining of Typical Solder Bump Structure and Controlled Interfacial Alloyed Metal Cu Post + SnAg / without barrier / No aging Cu Post + Sn100% / with Ni barrier / No aging Immediately After Mounting

| | Diffusion coefficient at 150°C |
|---|---|
| Cu in $Cu_3Sn$ | $3.06 \times 10^{-17}$ |
| Cu in $Cu_6Sn_5$ | $5.56 \times 10^{-16}$ |

1/18th

B. Chao et al., Journal of Applied Physics, 100, 084909, 2006

INTERFACIAL ALLOY LAYER FOR IMPROVING ELECTROMIGRATION (EM) RESISTANCE IN SOLDER JOINTS

TECHNICAL FIELD

The present invention relates generally to a semiconductor package and to a manufacturing method therefor. The present invention relates more specifically to a unique structure for an interfacial alloy layer which is able to improve the electromigration (EM) resistance of a solder joint, and a unique method of forming this structure.

BACKGROUND ART

With the demand for smaller and lighter electronic devices, it is expected to realize more highly integrated semiconductor packages.

In addition, there is demand for more reliable semiconductor packages and, as integrated circuits become increasingly miniaturized, electromigration (EM) resistance has become a growing issue and its effects can no longer be ignored.

Electromigration (EM) is a phenomenon in which there is a momentum exchange between electrons moving through an electrical conductor and metal atoms, the metal atoms gradually move, and defects (voids) occur in the shape of the metal. This phenomenon is more likely to occur when the current density is high.

According to theoretical considerations, when the current flowing in the circuit is the same, the current density known to be the square of k when the size (the height and width in the case of a rectangular circuit, the diameter in the case of a column-shaped circuit) is 1/k, and the effect of electromigration appears to increase at an accelerated rate.

The effects of electromigration can sometimes be severe. In the worst case, a portion of the circuit becomes disconnected, and the device rendered completely inoperable.

As a countermeasure, copper, which is less susceptible to electromigration, is used as the wiring material in semiconductor chips produced in the most recent semiconductor manufacturing processes. However, electromigration remains a problem in joints between semiconductor chips and package substrates as the power consumed per unit area of conductor increases because the current density in these joints is higher. Solder (for example, SnAg) is primarily used in joints between semiconductor chips and package substrates. Also, it is important to reduce current density to increase electromigration resistance.

One countermeasure is to use a structure with a copper pillar in the portions where the current crowding is likely to occur. However, when current is applied for a long period of time, voids caused by electromigration occur, and resistance increases.

Moreover, even when copper is used, there are still some effects of electromigration.

Another countermeasure being considered is to use nickel (Ni) as an anti-dispersion layer to inhibit the movement of metal electrons. However, a defect called a black pad sometimes occurs on the organic substrate side. If a Ni barrier is simply used on the chip side, the copper in the pad on the organic substrate side moves (elutes) into the solder, and this has adverse effects such as a rise in resistance.

Patent Literature 1 discloses a technology in which a semiconductor chip is exposed to high temperatures during practical use in order to form the intermetallic compound (IMC) $Cu_3Sn$, which inhibits occurrence of Kirkendall voids.

However, Patent Literature 1 does not mention the thickness of the $Cu_3Sn$ in relation to electromigration.

Patent Literature 2 discloses a technology in which electromigration is inhibited by joining components using solder balls containing a metallic core.

Patent Literature 3 inhibits electromigration by equalizing the current in joints via the incorporation of a pattern in the insulating layer between the bumps and pads of a semiconductor chip.

However, Patent Literature 2 and Patent Literature 3 require special solder balls and insulating layers, neither of which will remain viable as the joint pitches of semiconductor chips are further miniaturized.

Patent Literature 4 and Patent Literature 5 describe the formation of $Cu_3Sn$ via aging, but the explanation is only related to the hardness and brittleness that are characteristics of $Cu_3Sn$.

While Patent Literature 6 mentions the EM inhibiting effects of heating Cu wiring in an oxidizing atmosphere, it is only on the reference level.

Non-patent Literature 1 explains how the growth of intermetallic compounds (IMC) in the interface between the solder and the under bump metallurgy (UBM) is increased significantly by electromigration (EM) and creates voids.

Non-patent Literature 1 is helpful in providing a theoretical explanation of the creation of compositions such as $Cu_3Sn$ and $Cu_6Sn_5$ as intermetallic compounds of copper (Cu) and in (Sn).

CITATION LIST

Patent Literature

Patent Literature 1 International Laid-open Patent Publication No. WO2008/084673A1 (International Patent Application No. PCT/JP2007/074846)
Patent Literature 2 Laid-open Patent Publication No. 2011-187635
Patent Literature 3 Laid-open Patent Publication No. 2009-188107
Patent Literature 4 Laid-open Patent Publication No. 2002-254194
Patent Literature 5 Laid-open Patent Publication No. 2003-260587
Patent Literature 6 Laid-open Patent Publication No. 2010-40691
Patent Literature 7 Laid-open Patent Publication No. 2011-86837

Non-Patent Literature

Non-Patent Literature 1
Brook Chao, Seung-Hyun Chae, Xuefeng Zhang, Kuan-Hsun Lu, Min Ding, Jay Im, and Paul S. Ho, "Electromigration-Enhanced Intermetallic Growth and Void Formation in Pb-Free Solder Joints", Journal of Applied Physics 100, 084909 (2006).

SUMMARY OF INVENTION

Technical Problems

An object of the present invention is to improve the electromigration (EM) resistance of a solder joint.

Solution to Problems

The present invention provides a unique structure for an interfacial alloy layer which is able to improve the electromigration (EM) resistance of a solder joint, and a unique method of forming this structure.

More specifically, in this unique structure, a controlled interfacial alloy layer is provided on both sides of a solder joint. In order to form this structure, aging (maintenance of high-temperature conditions) is performed until an interfacial alloy layer of Cu3Sn has a thickness of at least 1.5 µm.

Effect of the Invention

The present invention is able to improve electromigration (EM) resistance in solder joints.

DESCRIPTION OF EMBODIMENT

Figure 1:
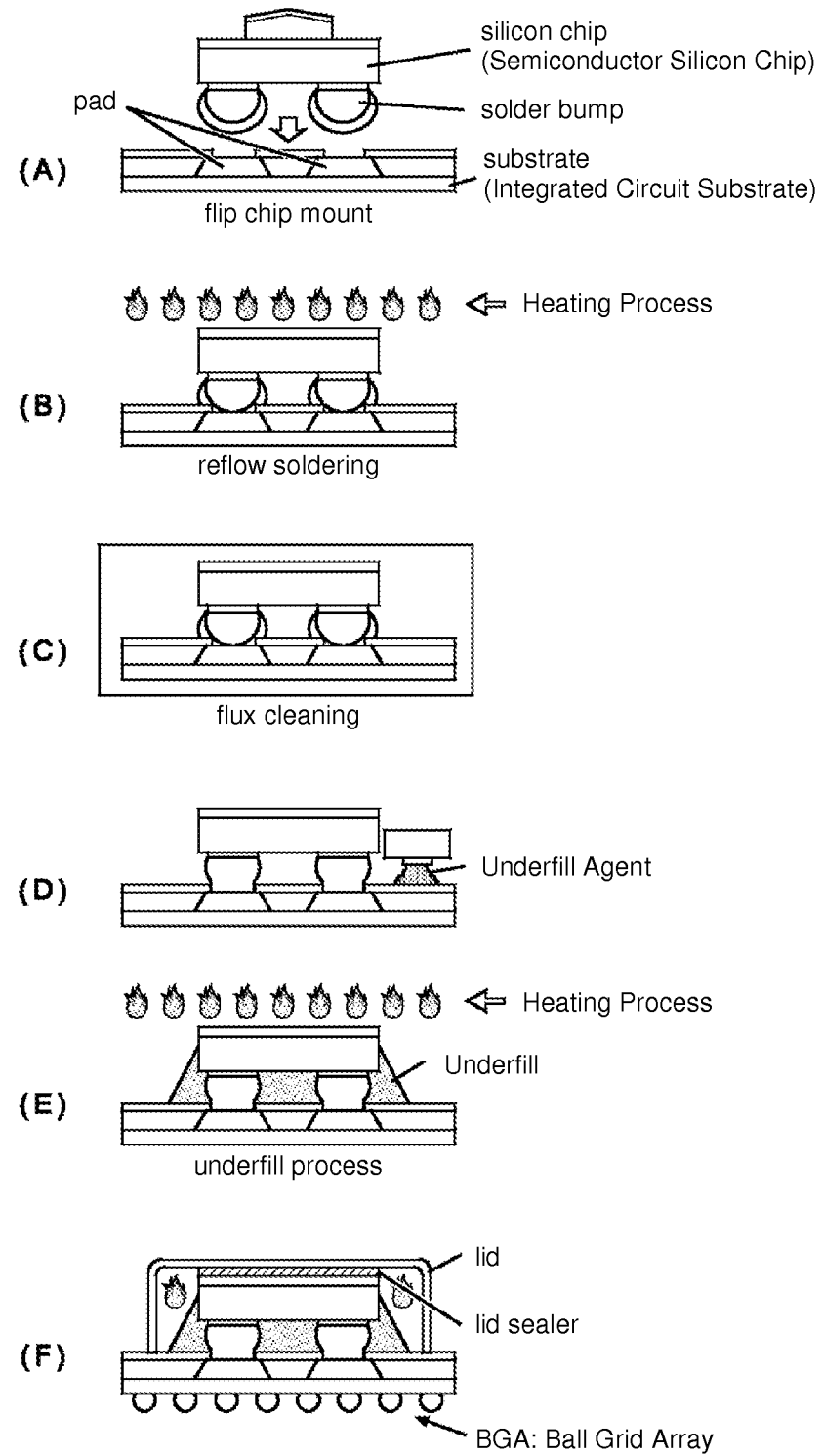
FIG. 1 is a diagram used to explain the configuration of a typical semiconductor package, and a method for manufacturing this package.

FIG. 1 is a diagram used to explain the configuration of a typical semiconductor package, and a method for manufacturing this package.

In the manufacture of a semiconductor package with multiple terminals, flip chips, including the C4 method, have gradually been adopted as the mounting method in place of conventional wire bonding.

The C4 method is an abbreviation for the controlled collapse chip connection method. Here, the expression C4 is derived from the first letter "C" in each of the four words.

Hump-shaped conductive protrusions called bumps are formed on the electrodes of a wafer for bonding to a substrate.

The use of this method makes a reduced mounting area and a smaller product possible. Because the wiring in the semiconductor is also shorter, the electrical characteristics are improved.

First, as shown in FIG. 1 (A), hump-shaped conductive protrusions called solder bumps are formed on a silicon chip (semiconductor silicon chip).

A solder bump is a conductor serving as an electrical communication route between the silicon chip (semiconductor silicon chip) and the substrate (integrated circuit substrate).

The bump material is usually solder, which is an alloy of in (Sn) and lead (Pb), but so-called lead (Pb) free solder is increasingly popular.

This process is called flip chip mounting.

While not shown in the drawing, solder balls may be mounted on the substrate (integrated circuit substrate).

In this case, flux is applied as a fixative to fix the solder balls to the metal electrodes on the substrate (integrated circuit substrate) which are known as pads.

The flux also removes surface oxide film from the pad electrodes. Flux printing precision is critical to the positioning of the flux.

Copper (Cu) is typically used as the pad electrodes in solder bonding.

Pre-soldering can also be performed, which consists of applying solder to the pad electrodes in advance.

Next, there is a heating process as shown in FIG. 1 (B).

The soldering is performed by melting the solder bumps and joining components via metal bonding.

This process is called reflow soldering.

Next, as shown in FIG. 1 (C) there is a process called flux cleaning.

In this process, the flux residue left by the reflow soldering is removed.

Next, as shown in FIG. 1 (D) and FIG. 1 (E), there is a process called the underfill process.

The thermal expansion coefficient of the silicon chip (semiconductor silicon chip) and the thermal expansion coefficient of the substrate (integrated circuit substrate) are different. The thermal stress owing to this difference may cause the terminals to crack and may damage the wiring in the chip.

In this process, an underfill agent is applied to provide a seal.

As shown in FIG. 1 (D), the underfill agent infiltrates between the chip and the substrate due to capillary action.

Here, as shown in FIG. 1 (E), there is a heating process. The infiltrating underfill agent is heat-cured, where a thermosetting resin is used as the underfill agent.

As shown in FIG. 1 (F), a plurality of solder balls is sometimes used as the electrodes mounted on the surface of the substrate (integrated circuit substrate) in what is called a ball grid array (BGA).

Here, as in FIG. 1 (B) and FIG. 1 (E), there is a heating process.

This is often sealed with a metal lid, which is a configuration expected to provide a heat sink effect.

When the semiconductor package has been completed, operation in the silicon chip (semiconductor silicon chip) itself generates heat. High temperatures continue to occur during use after the packaging is complete. These also provide the effects of a heating process.

During and after the manufacture of a semiconductor package, heat is applied in many (often unintended) locations.

The intermetallic compounds (IMC) formed during the manufacturing process and during operation after manufacturing (when a current is applied) is primarily Cu6Sn5. Only a thin film of Cu3Sn is formed.

Figure 2:
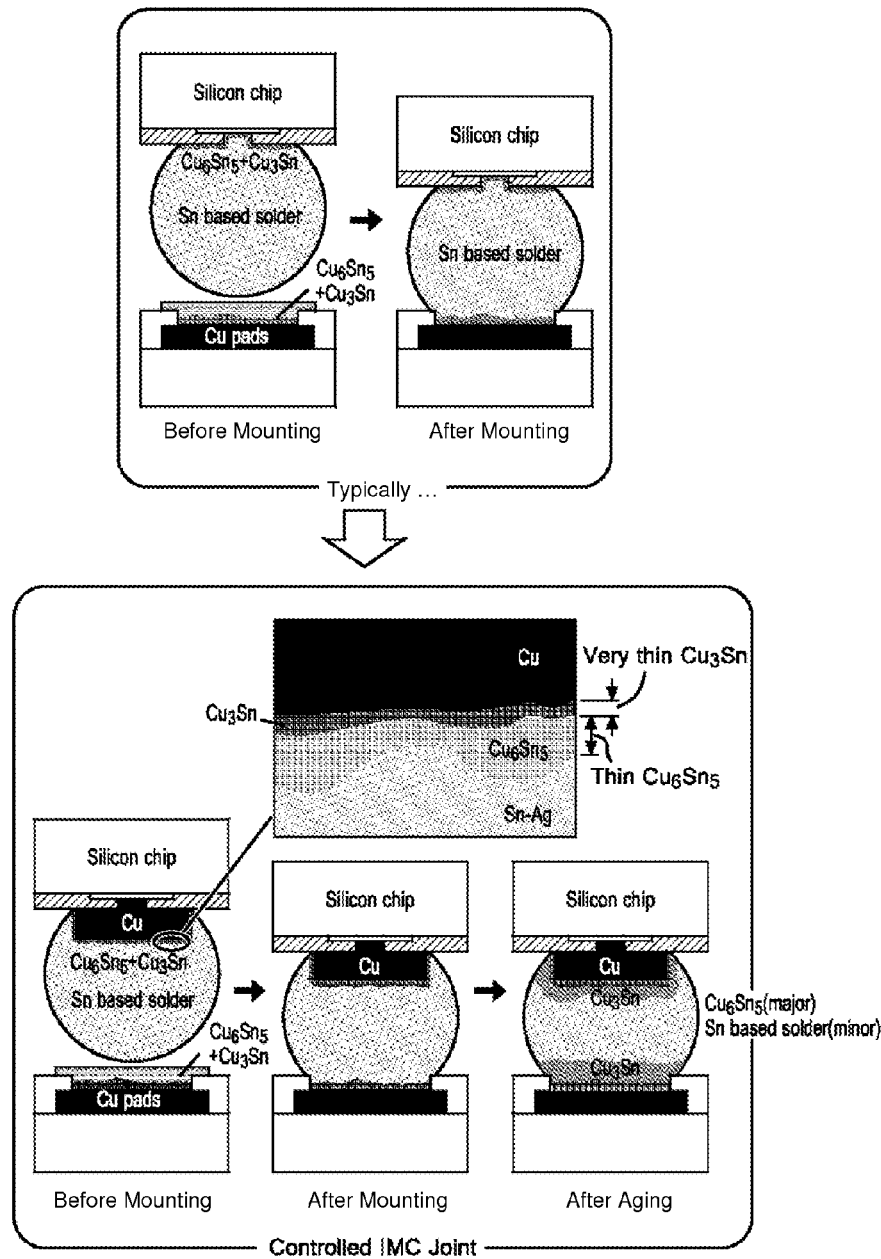
FIG. 2 is a diagram used to explain the unique structure of the interfacial alloy layer of the present invention which is able to improve electromigration (EM) resistance in the solder joints of a typical semiconductor package and to explain a manufacturing method for this package.

FIG. 2 is a diagram used to explain the unique structure of the interfacial alloy layer of the present invention which is able to improve electromigration (EM) resistance in the solder joints of a typical semiconductor package and to explain a manufacturing method for this package.

FIG. 2 corresponds to an enlarged view of a single solder bump in FIG. 1.

A tin (Sn) based solder structure (Sn-based solder) is used in the solder bump. A well-known example is SnAg.

Copper (Cu) is used as the pad metal in the solder joint.

Sometimes, intermetallic compounds of copper (Cu) and in (Sn) are already present on the pads of the substrate (integrated circuit substrate) and the pads of the silicon chip (semiconductor silicon chip).

In the "pre-mounting" state shown here, pre-soldering has been performed by applying, heating, and melting solder on the pads of the substrate (integrated circuit substrate) in advance.

Nearly all of the intermetallic compounds (IMC) of copper (Cu) and in (Sn) have the composition of Cu3Sn or Cu6Sn5. These intermetallic compounds (IMC) have different characteristics, which are important to the object of the present invention and are effectively utilized in the present invention.

Usually, the "pre-mounting" state becomes the "after mounting" state by applying heat in the reflow soldering process.

In the method of the present invention, a joint is formed between two structures which is able to control electromigration (EM). Put another way, a controlled IMC joint (controlled intermetallic compound joint) is formed.

In the "before mounting" state, a copper (Cu) structure is prepared as the pad on the silicon chip (semiconductor silicon chip) side. A in (Sn) based solder structure is prepared and brought into contact with this copper (Cu) structure.

In the "before mounting" state, the copper (Cu) structure on the silicon chip (semiconductor silicon chip) side is joined with the in (Sn) based (ball-shaped) solder structure, and intermetallic compounds are formed between them.

From the "before mounting" state, the copper (Cu) structure on the substrate (integrated circuit substrate) side and the in (Sn) based solder structure (pre-soldered structure) are joined, and intermetallic compounds are formed between the two.

A good wettability and compatibility can be obtained by using the same composition between the (ball-shaped) solder and the (pre-soldered) solder.

The intermetallic compounds Cu3Sn and Cu6Sn5 are formed in the joint between the copper (Cu) and the in (Sn). At this stage, as shown in the enlarged drawing, the Cu6Sn5 is thin and the Cu3Sn is very thin.

When the temperature is raised above the melting-point temperature of the solder structure, a solder joint is formed between the solder structure and the copper (Cu) structure, and the intermetallic compounds Cu3Sn and Cu6Sn5 are formed inside. The state shown in the drawing is the "after mounting" state.

In the method of the present invention, the solder joint is additionally aged (high-temperature conditions are maintained) for 10 to 2,000 hours in a temperature range of 150° C. to 200° C.

In this unique aging process, the thickness of the intermetallic compound Cu3Sn (interfacial) alloy layer exceeds 1.5 μm in the copper (Cu) and the intermetallic compounds Cu3Sn, Cu6Sn5 formed in the previously formed solder joint.

The state shown in the drawing is the "after aging" state.

Figure 3:
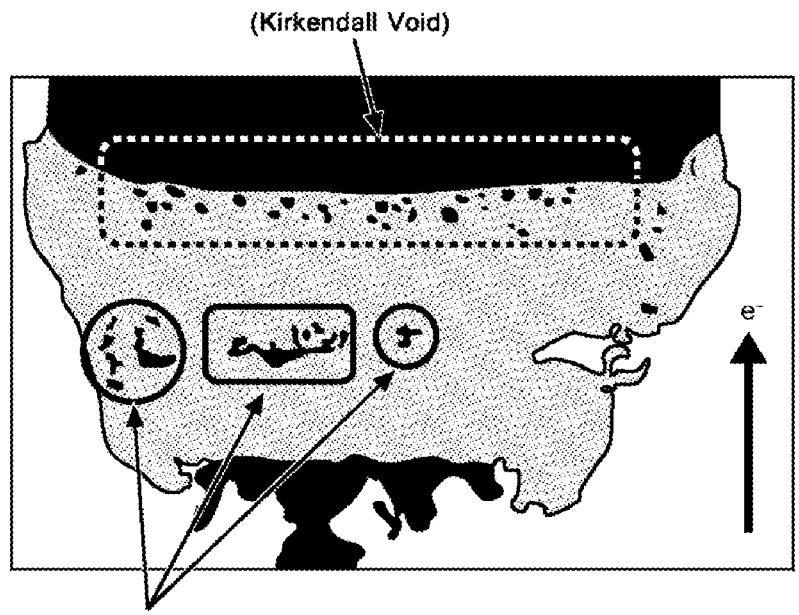
FIG. 3 is a diagram used to explain defects (voids) produced by electromigration (EM).
Figure 3:
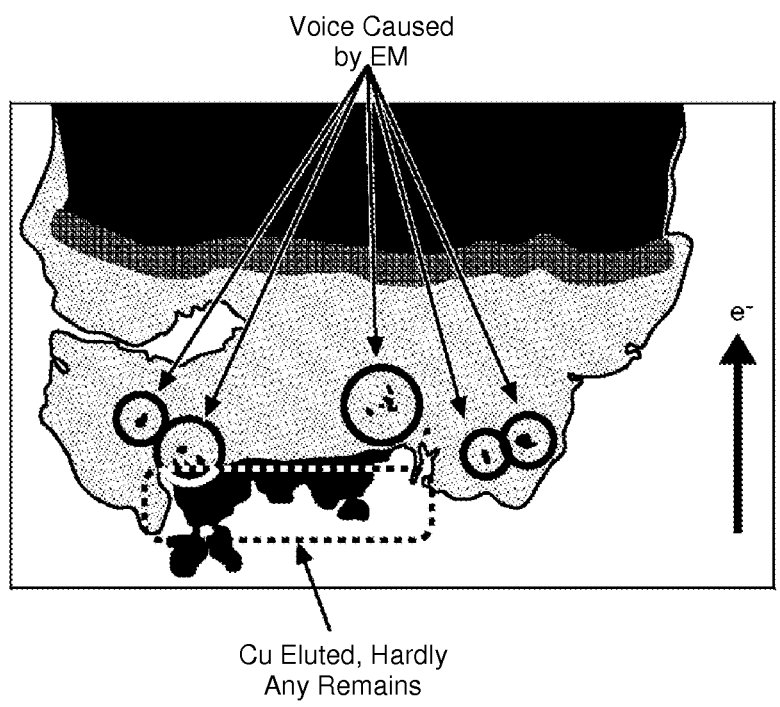

FIG. 3 is a diagram used to explain defects (voids) produced by electromigration (EM).

In both the upper and the lower drawings, the unique aging process of the present invention is not performed (no aging).

In the test conditions for the upper drawing, SnAg is joined to a Cu post without a barrier.

Here, Kirkendall voids occur near the Cu on the upper side of the chip.

These voids are caused by EM. These voids caused by EM grow as current flows through.

In the test conditions for the lower drawing, 100% Sn is joined to a Cu post, and nickel (Ni) is used as an anti-dispersion layer.

When a Ni barrier is provided, Kirkendall voids are kept from occurring near the Cu on the upper side of the chip.

However, the occurrence of voids caused by EM cannot be completely avoided.

Also, the copper pads on the organic substrate side elute into the solder. The portions with hardly any Cu are visible. This may have an adverse effect on its function as a conductor, and the resistance may rise.

Figure 4:
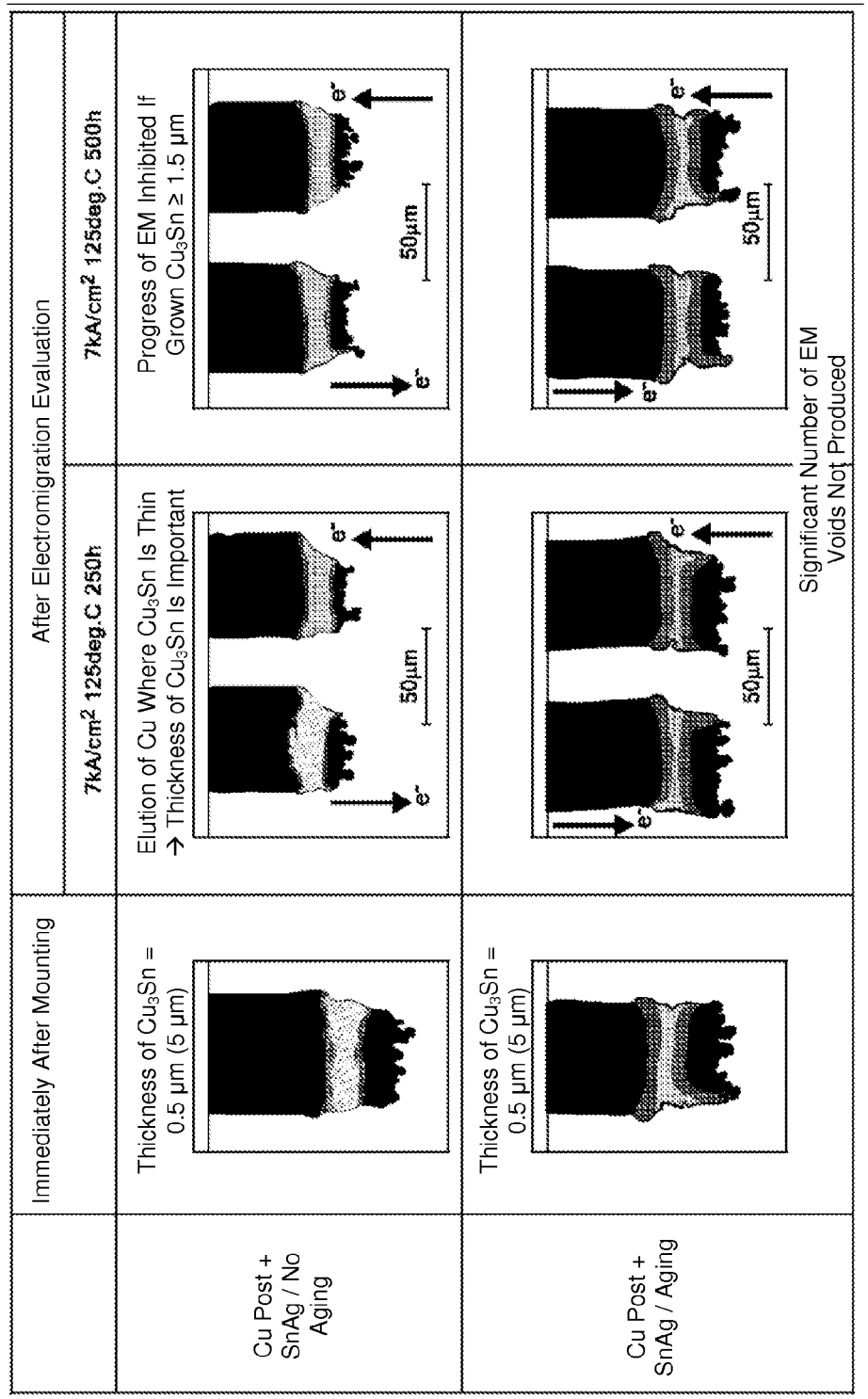
FIG. 4 is a diagram evaluating and comparing the effects of electromigration (EM) suppression based on the thickness of the Cu3Sn (interfacial) alloy layer in the present invention.

FIG. 4 is a diagram evaluating and comparing the effects of electromigration (EM) suppression based on the thickness of the Cu3Sn (interfacial) alloy layer which is aged in the present invention.

In this test, a first copper (Cu) structure, a second copper (Cu) structure, and a in (Sn) based solder structure are prepared as pillar-shaped structures with a diameter of 35 μm to 100 μm. The diameter here is 50 μm±5 μm. This corresponds closely to the miniaturization for a joining pitch used in semiconductor chips.

In this test, the current density is 7 kA/cm2.

The present inventor came to realize that the thickness of the Cu3Sn is important to the suppression of electromigration (EM).

More specifically, it became clear that electromigration (EM) could be effectively suppressed if the (interfacial) alloy layer of intermetallic compound Cu3Sn of the solder joint is grown to a thickness exceeding 1.5 μm in the copper (Cu) and the intermetallic compounds Cu3Sn, Cu6Sn5 formed in the previously formed solder joint.

The near absence of EM voids was confirmed.

Figure 5:
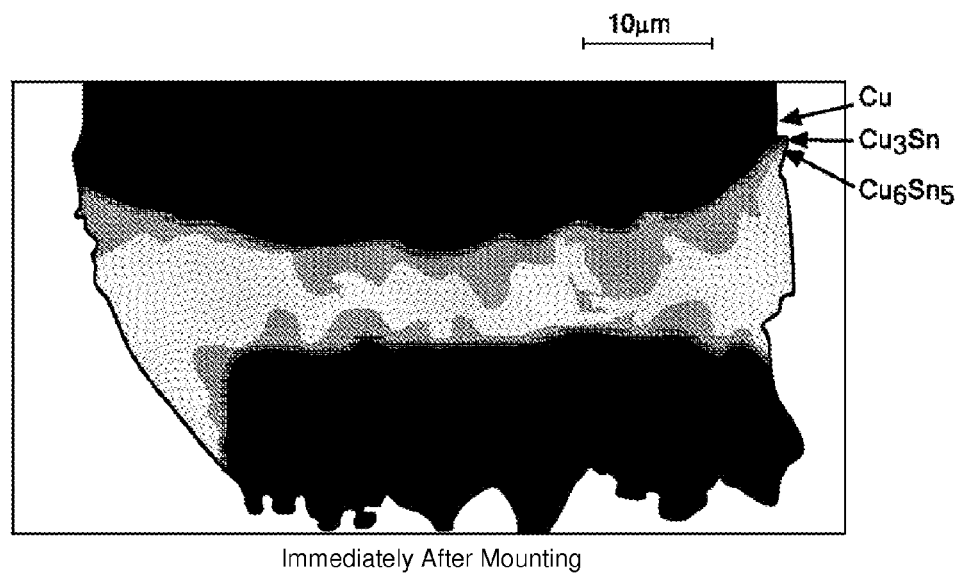
FIG. 5 is an enlarged view showing the interface between the copper (Cu) and the in (Sn) immediately after mounting.

FIG. 5 is an enlarged view showing the interface between the copper (Cu) and the in (Sn) immediately after mounting.

The Cu3Sn has not grown to a significant thickness immediately after mounting.

When the diffusion coefficients of the Cu in the Cu3Sn and in the Cu6Sn5 were compared under temperature conditions of 150° C., the diffusion coefficient of the Cu3Sn was 1/18th that of the Cu6Sn5.

In principle, the Cu3Sn forms a diffusion-suppressing barrier which is believed to significantly suppress the elution of Cu and the formation of voids.

Because Cu3Sn has a flat organizational structure compared to the irregular organizational structure of Cu6Sn5, it is believed to be suitable for use as a barrier layer.

Figure 6:
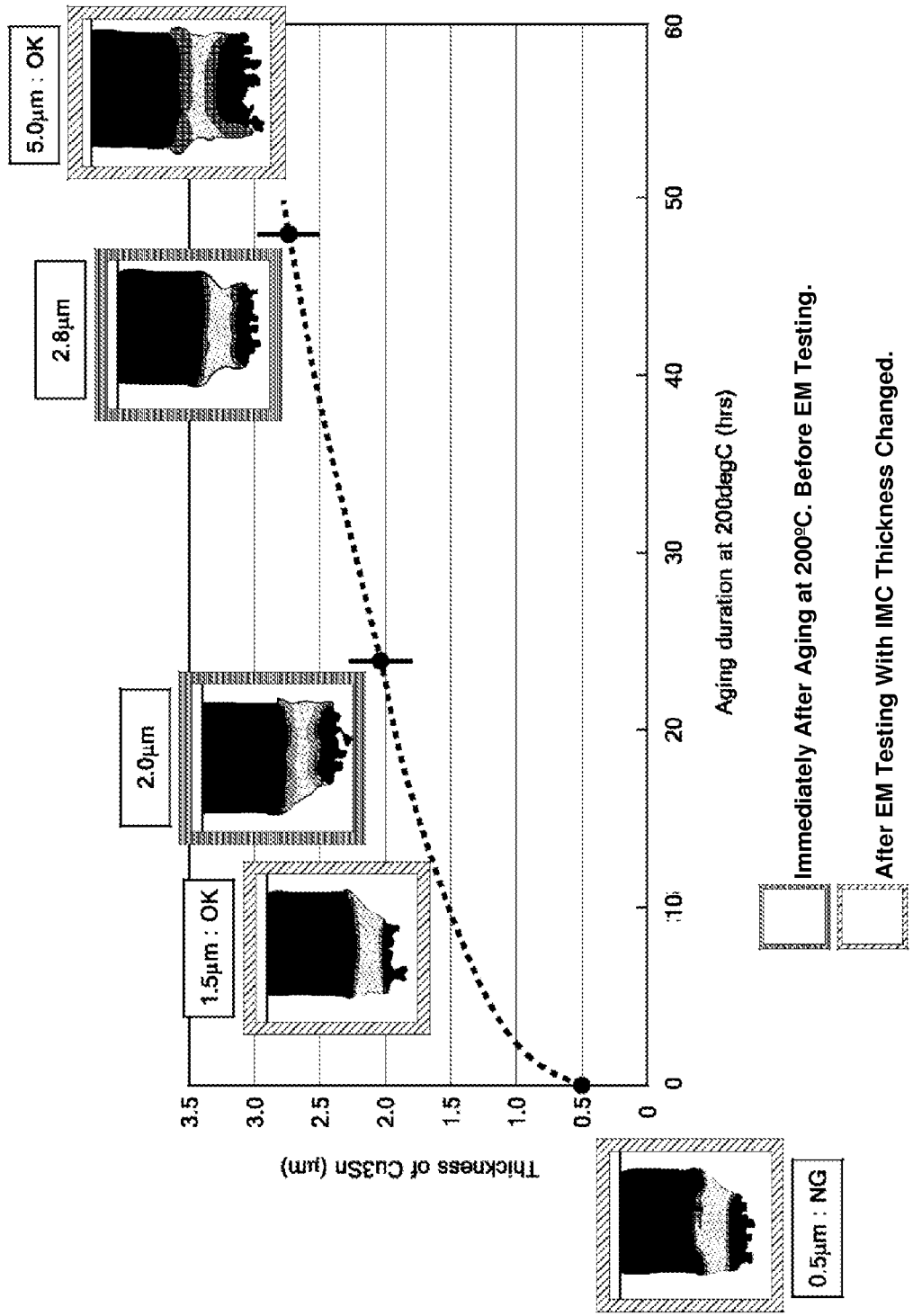
FIG. 6 is a graph of the results of testing showing the relationship between the aging and the thickness of the grown Cu3Sn (interfacial) alloy layer.

FIG. 6 is a graph of the results of testing showing the relationship between the aging and the thickness of the grown Cu3Sn (interfacial) alloy layer. Here, it is clear that an electromigration (EM) suppressing effect is obtained when the (interfacial) alloy layer of the intermetallic compound Cu3Sn has grown to a thickness exceeding 1.5 μm. At an approximate thickness of 0.5 μm, the electromigration (EM) suppressing effect is insufficient (NG).

Figure 7:
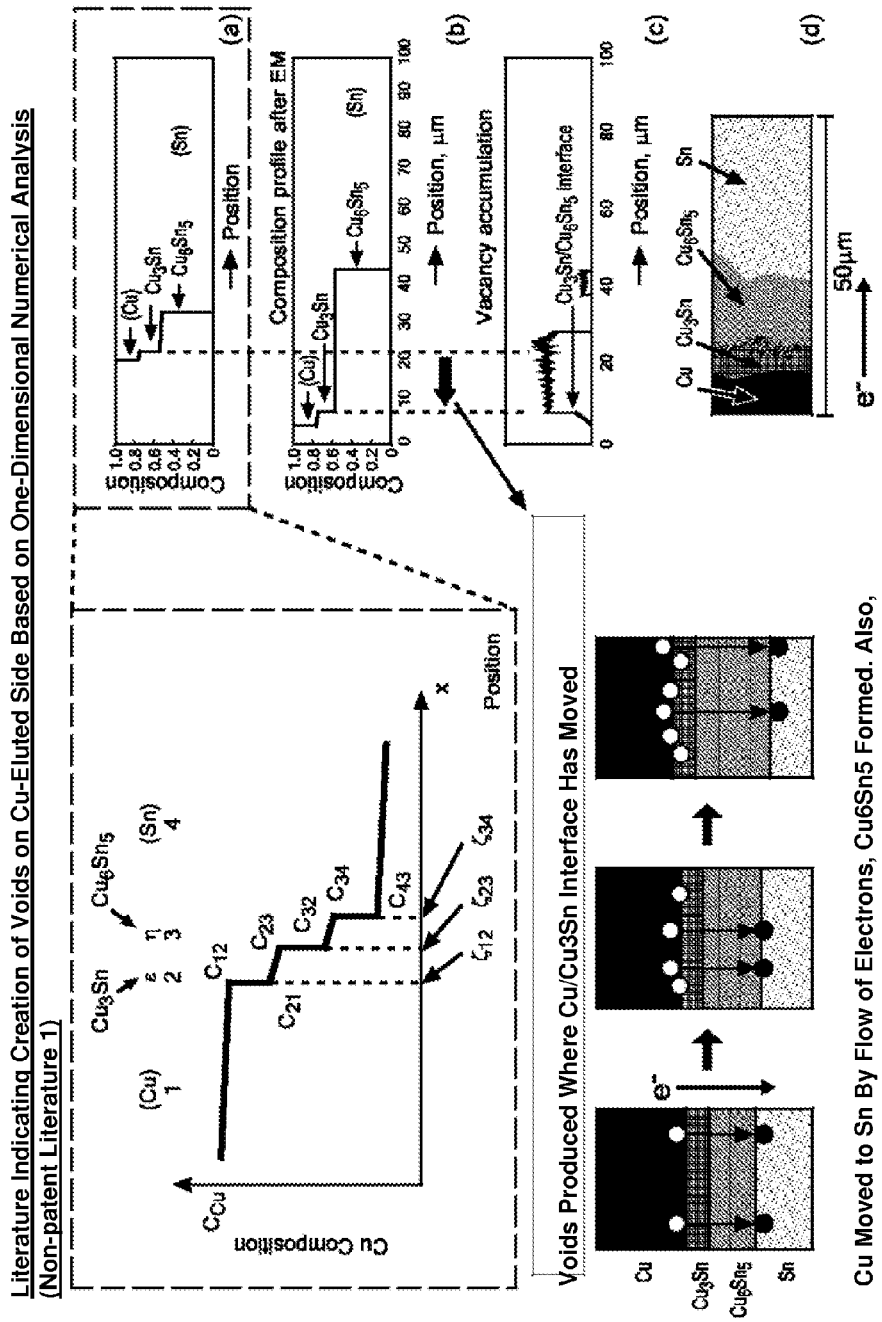
FIG. 7 is a diagram explaining the principles of void formation described in Non-patent Literature 1 which occurs when the growth of intermetallic compounds (IMC) at the interface between the solder and the under bump metallurgy (UBM) increases considerably due to electromigration (EM).

FIG. 7 is a diagram explaining the principles of void formation described in Non-patent Literature 1 which occurs when the growth of intermetallic compounds (IMC) at the interface between the solder and the under bump metallurgy (UBM) increases considerably due to electromigration (EM).

This provides a theoretical explanation of the compositions of Cu3Sn and Cu6Sn5, which are the intermetallic compounds of copper (Cu) and in (Sn).

Figure 8:
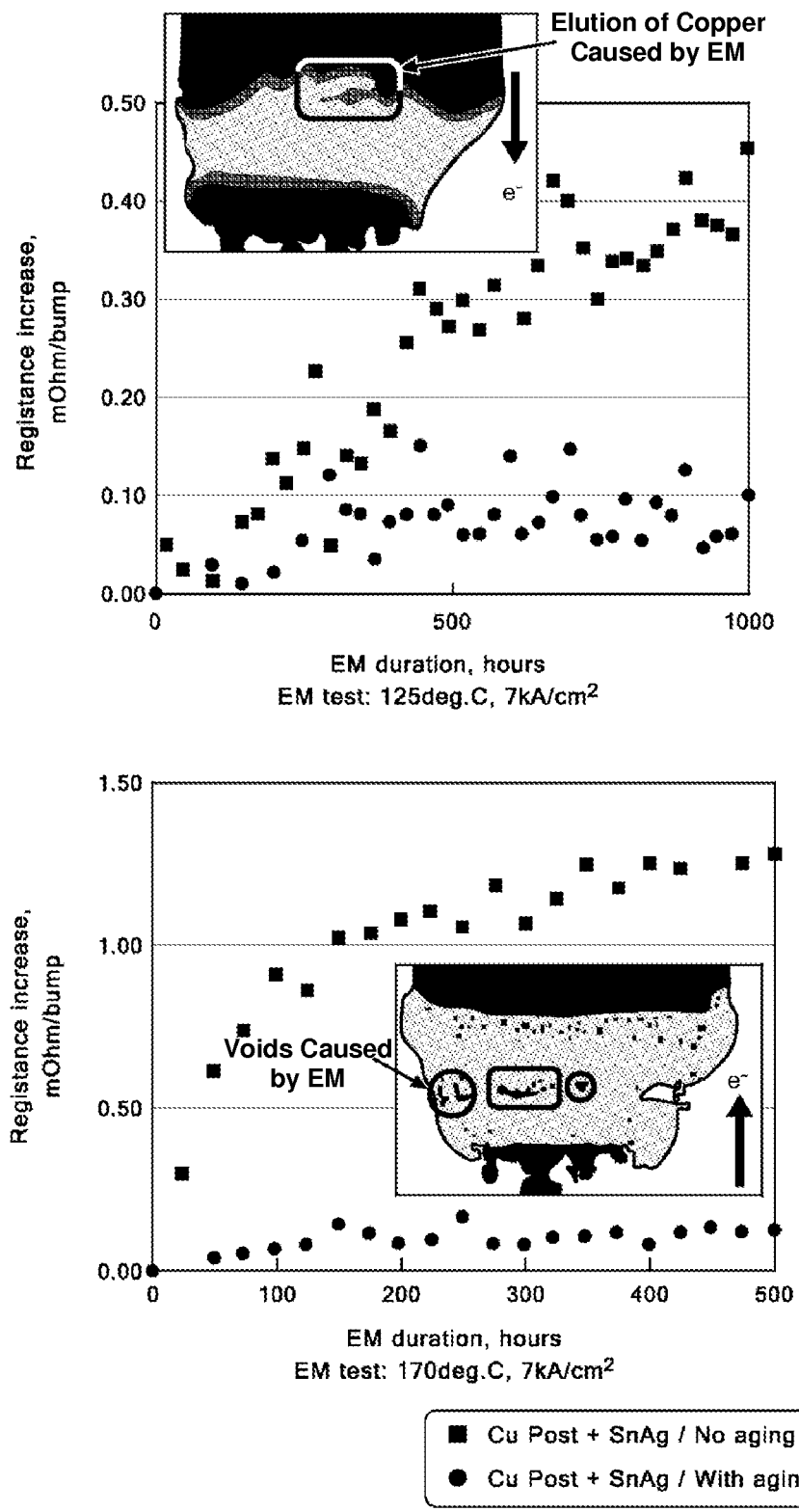
FIG. 8 is a graph of the results of testing showing the relationship between time and rising resistance values.

FIG. 8 is a graph of the results of testing showing the relationship between time and rising resistance values in the aging of the present invention.

Because the occurrence of voids appears in the form of increased resistance, this can be used indirectly (non-destructively) to determine their presence.

Compared to a situation with no aging, aging results in hardly any increased resistance, and maintains a low resistance value.

The invention claimed is:

1. A joint structure between two structures able to control electromigration (EM), the structure comprising:
   a first copper (Cu) structure and a second copper (Cu) structure brought into contact via a tin (Sn) based solder structure;
   a solder joint located between the first and second copper structures, wherein the solder joint includes an intermetallic compound $Cu_3Sn$ and an intermetallic compound $Cu_6Sn_5$ therein, wherein the intermetallic compound $Cu_3Sn$ has a thickness exceeding 1.5 μm on both an interface between the first copper (Cu) structure and a first end of the solder joint, and an interface between the second copper (Cu) structure and a second end of the solder joint opposite to the first end, wherein a thickness of the intermetallic compound $Cu_3Sn$ is less than a thickness of the intermetallic compound $Cu_6Sn_5$.

2. A semiconductor package comprising: a structure according to claim 1, a semiconductor chip joined to the structure, and an integrated circuit substrate joined to the structure.

3. A semiconductor package according to claim 2, wherein the semiconductor silicon chip is sealed by a lid.

4. A structure according to claim 1, wherein the structure is formed by performing aging (maintaining high-temperature conditions) for 10 to 2,000 hours in a temperature range of 150° C. to 200° C. in the copper (Cu) and the intermetallic compounds $Cu_3Sn$, $Cu_6Sn_5$ formed in the previously formed solder joint.

5. A structure according to claim 1, wherein the first copper (Cu) structure, the second copper (Cu) structure, and the tin (Sn) based solder structure are a pillar-like structure having a diameter of 35 μm to 100 μm.

6. A structure according to claim 5, wherein the first copper (Cu) structure, the second copper (Cu) structure, and the tin (Sn) based solder structure are a pillar-like structure of 50 μm±5 μm.

* * * * *